(12) United States Patent
Utsumi et al.

(10) Patent No.: US 9,978,598 B2
(45) Date of Patent: May 22, 2018

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki-shi, Kanagawa (JP)

(72) Inventors: Makoto Utsumi, Tsukuba (JP); Yoshiyuki Sakai, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days. days.

(21) Appl. No.: 15/417,872

(22) Filed: Jan. 27, 2017

(65) Prior Publication Data
US 2017/0271157 A1   Sep. 21, 2017

(30) Foreign Application Priority Data
Mar. 16, 2016 (JP) .................................. 2016-053120

(51) Int. Cl.
| | |
|---|---|
| *H01L 29/15* | (2006.01) |
| *H01L 21/04* | (2006.01) |
| *H01L 29/16* | (2006.01) |
| *H01L 29/45* | (2006.01) |
| *H01L 29/78* | (2006.01) |

(52) U.S. Cl.
CPC ...... *H01L 21/0485* (2013.01); *H01L 29/1608* (2013.01); *H01L 29/45* (2013.01); *H01L 29/7802* (2013.01)

(58) Field of Classification Search
None
See application file for complete search history.

(56) References Cited

U.S. PATENT DOCUMENTS

| | | | |
|---|---|---|---|
| 2003/0107041 A1 | 6/2003 | Tanimoto et al. | |
| 2007/0221253 A1 | 9/2007 | Nishikido | |
| 2012/0319135 A1 | 12/2012 | Tamaso | |
| 2013/0062624 A1* | 3/2013 | Tsuchiya | H01L 29/0839 257/77 |

FOREIGN PATENT DOCUMENTS

| | | |
|---|---|---|
| JP | H01-268121 A | 10/1989 |
| JP | H07-99169 A | 4/1995 |
| JP | 2003-243654 A | 8/2003 |
| JP | 2012-099598 A | 5/2012 |
| WO | WO-2005/117081 A1 | 12/2005 |

* cited by examiner

*Primary Examiner* — Cory Eskridge
(74) *Attorney, Agent, or Firm* — Rabin & Berdo, P.C.

(57) ABSTRACT

A silicon carbide semiconductor device includes a silicon carbide semiconductor substrate; a nickel silicide film provided on a surface of the silicon carbide semiconductor substrate and functioning as an ohmic contact; and an extraction electrode contacting the ohmic contact on a side different from a silicon carbide semiconductor substrate side. The silicon carbide semiconductor substrate side of the ohmic contact is mainly formed from a NiSi phase and an extraction electrode side thereof is mainly formed from a $Ni_2Si$ phase. The ohmic contact includes carbon on the silicon carbide semiconductor substrate and includes no carbon on the extraction electrode side.

4 Claims, 6 Drawing Sheets

| | ATTAINED TEMPERATURE (°C) STANDARD RTA | | | | | | |
|---|---|---|---|---|---|---|---|
| | 650 | 700 | 750 | 800 | 850 | 900 | 1000 |
| NiSi LAYER THICKNESS (nm) | 0 | 0 - 2 | 4 - 6 | 8 - 15 | 20 - 30 | 30 - 40 | >50 PERMEATION ON SUBSTRATE SIDE |
| CARBON CONCENTRATION NEAR SUBSTRATE (at%) | 0 | 0 - 5 | 5 - 15 | 15 - 20 | 15 - 20 | 15 - 20 | 15 - 20 |
| CARBON CONCENTRATION NEAR EXTRACTION ELECTRODE (at%) | 0 | 0 | 0 | 0 | 0 | 0 - 5 | 5 - 20 |

FIG.2

| | ATTAINED TEMPERATURE (°C) STANDARD RTA | | | | | | | |
|---|---|---|---|---|---|---|---|---|
| | 650 | 700 | 750 | 800 | 850 | 900 | 1000 |
| NiSi LAYER THICKNESS (nm) | 0 | 0 - 2 | 4 - 6 | 8 - 15 | 20 - 30 | 30 - 40 | >50 PERMEATION ON SUBSTRATE SIDE |
| CARBON CONCENTRATION NEAR SUBSTRATE (at%) | 0 | 0 - 5 | 5 - 15 | 15 - 20 | 15 - 20 | 15 - 20 | 15 - 20 |
| CARBON CONCENTRATION NEAR EXTRACTION ELECTRODE (at%) | 0 | 0 | 0 | 0 | 0 | 0 - 5 | 5 - 20 |

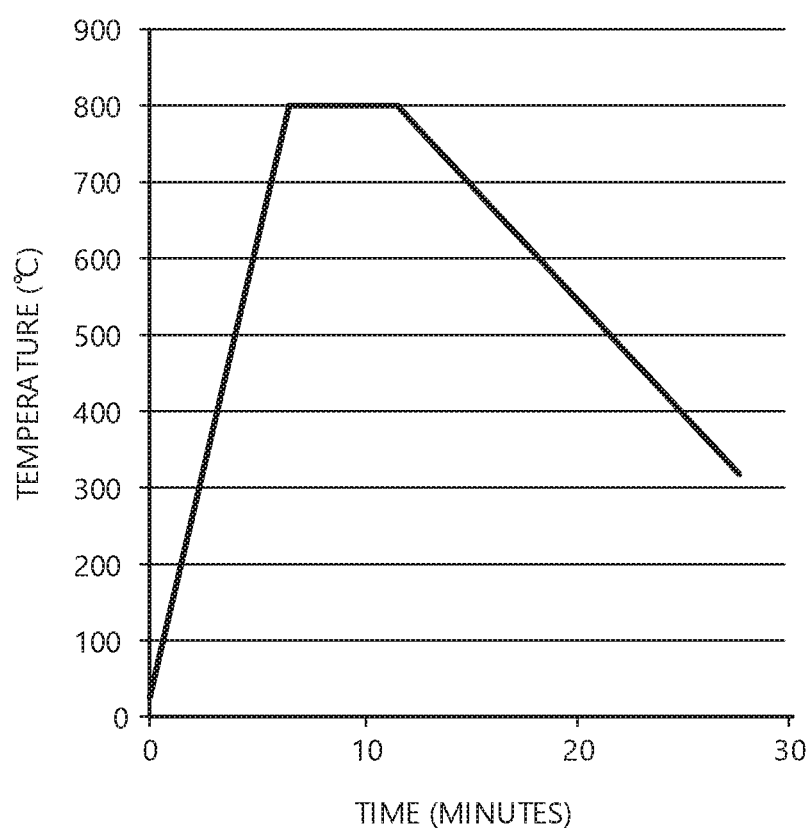

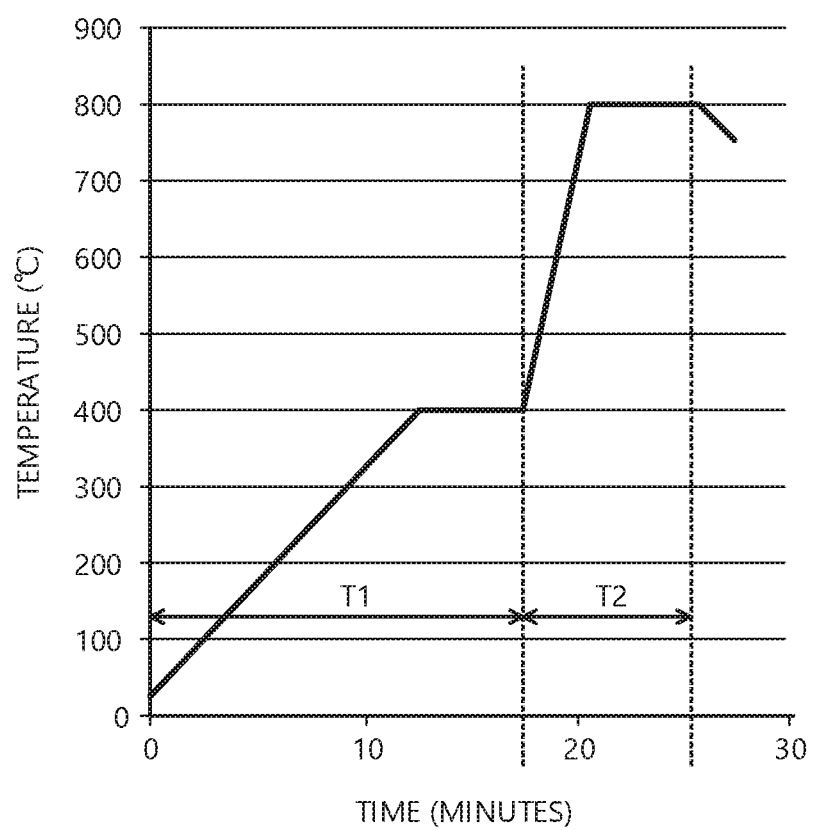

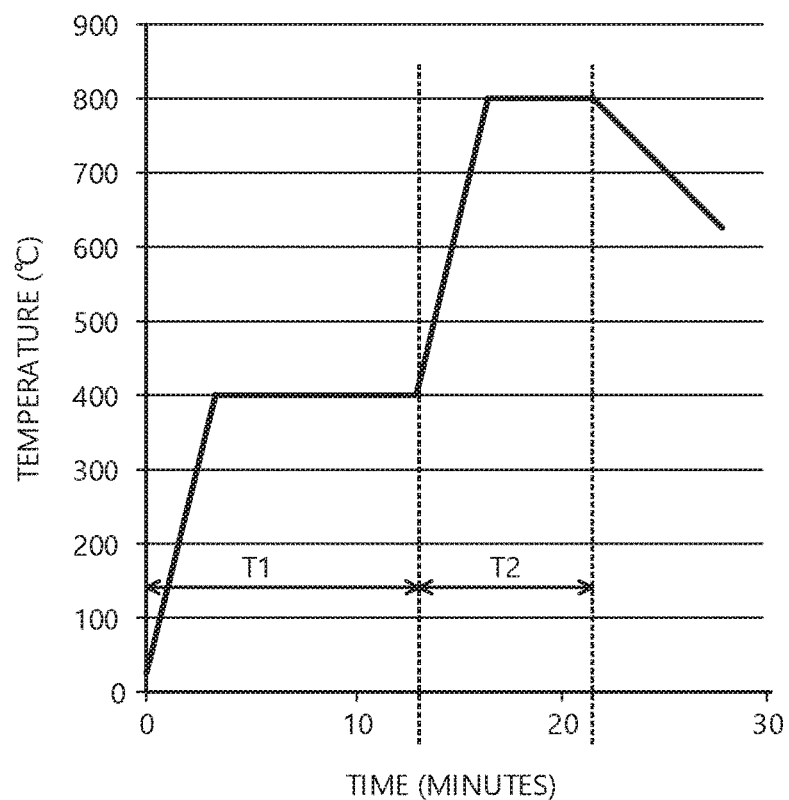

FIG.7

| | IMMERSION TIME IN DILUTE HYDROFLUORIC ACID (SECONDS) | | | | | | |
|---|---|---|---|---|---|---|---|
| | 0 | 10 | 20 | 30 | 45 | 60 |
| CONTACT RESISTANCE $\times 10^{-5} \Omega cm^2$ | 5 | 5 | 10 | 40 | 200 | 1400 |
| NiSi LAYER THICKNESS (nm) | 8 - 15 | 8 - 15 | 5 - 10 | 4 - 6 | 0 - 5 | 0 - 2 |

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2016-053120, filed on Mar. 16, 2016, the entire contents of which are incorporated herein by reference.

BACKGROUND OF THE INVENTION

1. Field of the Invention

Embodiments of the invention relate to a method of manufacturing a silicon carbide semiconductor device and a silicon carbide semiconductor device in which silicon carbide (SiC) is used as a semiconductor material and in particular, in which current flows from a front surface side to a rear surface side of a semiconductor substrate.

2. Description of the Related Art

A silicon carbide semiconductor material has a large bandgap compared to a silicon (Si) semiconductor material and therefore, has high dielectric breakdown field strength. On-resistance, which is resistance in a conduction state, is inversely proportional to the third power of the dielectric breakdown field strength and therefore, for example, with widely used silicon carbide semiconductor materials called 4-H type (4-layer periodic hexagonal crystal:4H-SiC), the on-resistance may be suppressed to 1 few-hundredths of that of a silicon semiconductor material.

Therefore, combined with their property of high thermal conductivity enabling easy heat dissipation, silicon carbide semiconductor materials are expected for use in next generation power semiconductor elements having low loss. For example, silicon carbide semiconductor elements of various structures such as Schottky barrier diodes, metal oxide field effect transistors (MOSFETs), PN diodes, insulated gate bipolar transistors (IGBTs), gate turnoff thyristors (GTOs), and the like that use a silicon carbide semiconductor material are being developed.

A material and method of forming an ohmic electrode, important in forming a silicon carbide semiconductor element, have been presented (for example, refer to Japanese Patent Application Laid-Open Publication No. H1-268121). It has been shown that in an n-type region, when nickel (Ni) is used as a material and heat treatment is performed at about 1000 degrees C. under reduced pressure or in an inert gas atmosphere, a nickel silicide is formed and this silicide functions as an ohmic electrode.

On the other hand, an ohmic electrode in a MOSFET is formed in an ohmic contact hole opened in an interlayer insulating film, after a gate oxide film, a gate electrode, and the interlayer insulating film are formed. It has been shown that by annealing in a case of forming such an ohmic electrode, an unexpected reaction progresses at a MOS interface and since the MOS interface property is subject to severe damage, the annealing temperature has to be suppressed to 850 degrees C. or less (for example, refer to Japanese Patent Application Laid-Open Publication No. 2003-243654).

A technique of controlling annealing to 850 degrees C. or less when the ohmic electrode is formed has been disclosed (for example, refer to Japanese Patent Application Laid-Open Publication No. H7-99169). In this technique, after a nickel silicon alloy is formed, heat treatment at 700 degrees C. or less is performed whereby a silicide is formed by a solid-phase reaction of the nickel silicon alloy, without reacting the silicon carbide semiconductor substrate and the nickel silicon alloy. Further, a technique of using laser irradiation after nickel silicon alloy formation to locally perform heat treatment for short periods and suppress the amount of carbon that reaches the ohmic electrode surface to a concentration that is less than that of the nickel element has been disclosed (for example, refer to Japanese Patent Application Laid-Open Publication No. 2012-99598).

Further, it has been disclosed that when a nickel silicide is formed on a silicon substrate, by defining the nickel film thickness and annealing temperature, the composition of the nickel silicide to be formed may be controlled. It has been shown that this is because a solid-phase reaction at a contact interface of the nickel and silicon begins from about 250 degrees C. and progresses dependent on the temperature whereby the composition of nickel silicide formed is uniquely determined by the nickel film thickness.

SUMMARY OF THE INVENTION

A silicon carbide semiconductor device according to one aspect of the present invention includes a silicon carbide semiconductor substrate; a nickel silicide film provided on a surface of the silicon carbide semiconductor substrate and functioning as a contact electrode; and an extraction electrode formed contacting the contact electrode on a side different from a silicon carbide semiconductor substrate side. The silicon carbide semiconductor substrate side of the contact electrode is mainly formed from a NiSi phase and an extraction electrode side of the contact electrode is mainly formed from a $Ni_2Si$ phase. The contact electrode includes carbon on the silicon carbide semiconductor substrate side and includes no carbon on the extraction electrode side.

A method of manufacturing a silicon carbide semiconductor device according to another aspect of the present invention includes removing an insulating film formed on a surface of a silicon carbide semiconductor substrate, the insulating film being removed by dry etching using a fluorine-based gas and noble gas; selectively forming a nickel film on the surface of the silicon carbide semiconductor substrate so as to include silicon at 20 at % or more and 40 at % or less; and forming a silicide by an annealing process of indirectly heating the silicon carbide semiconductor substrate by heat conduction from a support. The annealing process is performed at a temperature higher than 700 degrees C. and 850 degrees C. or less.

In the method of manufacturing a silicon carbide semiconductor device, the annealing process includes heating to 400 degrees C. and a first maintaining process, and heating to 850 degrees C. or less and a second maintaining process after the heating to 400 degrees C. and the first maintaining process. A total time of the heating to 400 degrees C. and the first maintaining process is longer compared to a total time of the heating to 850 degrees C. or less and the second maintaining process.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 2 is a chart depicting NiSi phase thickness and carbon content at each temperature of the silicon carbide semiconductor device according to the first embodiment;

FIGS. 3, 4, and 5 are charts each depicting heat application characteristics (annealing sequence) of the silicon carbide semiconductor substrate according to the first embodiment;

FIG. 6 is a chart depicting contact resistance in each of the heat application characteristics of the silicon carbide semiconductor substrate according to the first embodiment; and FIG. 7 is a chart depicting immersion time of the silicon carbide semiconductor substrate according to the first embodiment in a dilute hydrofluoric acid, and NiSi phase thickness and contact resistance measured by a TLM method.

DETAILED DESCRIPTION OF THE INVENTION

Figure 1:
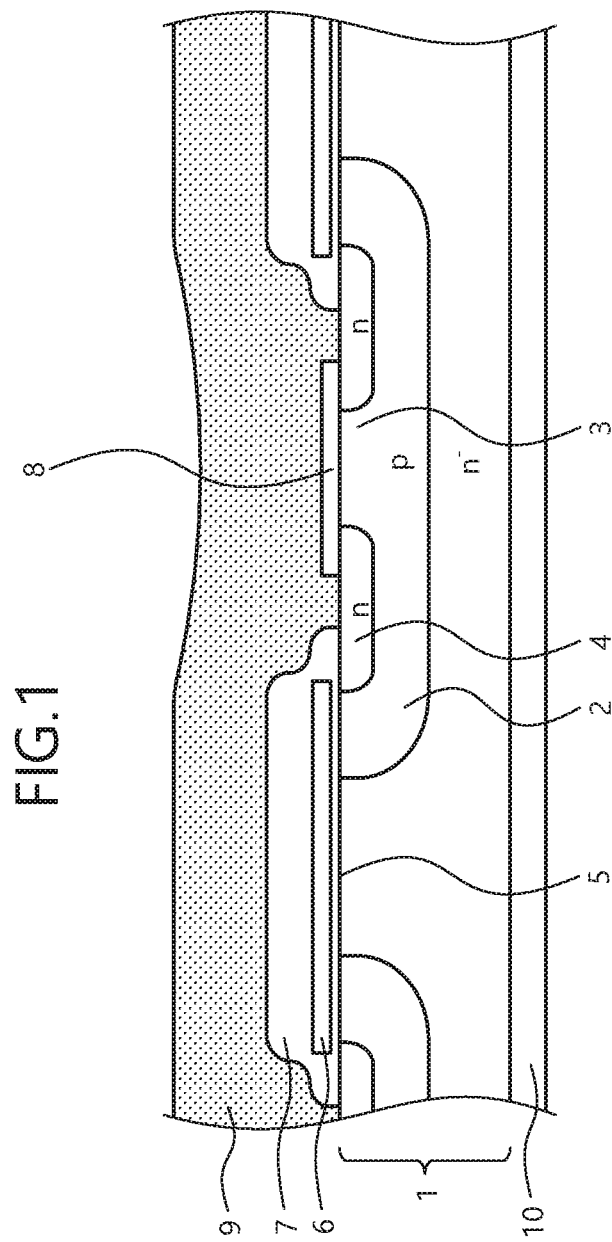
FIG. 1 is a cross-sectional view of a silicon carbide semiconductor device according to a first embodiment of the present invention.

Results of investigation by the inventor revealed that a solid-phase reaction at an interface of a silicon carbide semiconductor and a nickel silicide occurs at a lower temperature than a solid-phase reaction at an interface of a silicon carbide semiconductor and nickel. It is presumed that carbon in the silicon carbide has a bonding mechanism with silicon in the nickel silicide whereby the silicon in the silicon carbide easily diffuses to the nickel side.

Embodiments according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described. Further, in the present description, when Miller indices are described, "−" means a bar added to an index immediately after the "−", and a negative index is expressed by prefixing "−" to the index.

A method of manufacturing a silicon carbide semiconductor device according to a first embodiment will be described taking as an example, a case where a p-type well region and an n-type source region are each formed by an ion implantation (double implant) process, producing (manufacturing) a double-implant-type MOSFET (DIMOSFET).

FIG. 1 is a cross-sectional view of a silicon carbide semiconductor device according to the first embodiment of the present invention. Manufacturing of the silicon carbide semiconductor device will be described. For example, an n⁻-type silicon carbide single-crystal semiconductor substrate (hereinafter, n⁻-type silicon carbide substrate) 1 formed from a silicon carbide 4-layer periodic hexagonal crystal (4H-SiC), on which an n-type silicon carbide epitaxial layer is stacked on one principal surface is prepared.

Next, in the n⁻-type silicon carbide substrate (surface layer of the n⁻-type silicon carbide epitaxial layer) 1, a p-type well region 2, and in the p-type well region 2, a p-type contact region 3 and an n-type source region 4 are respectively formed by ion implantation.

When the p-type well region 2, the p-type contact region 3, and the n-type source region 4 are formed, this ion implantation is performed by introducing into an ion implantation apparatus, the n⁻-type silicon carbide substrate 1 on which an ion implantation mask of a silicon oxide film, etc. is formed having openings corresponding to the p-type well region 2, the p-type contact region 3, and the n-type source region 4. A region of an n-type is formed by implanting phosphorus ions or nitrogen ions. A region of a p-type is formed by implanting aluminum ions, etc. As a result, in the n⁻-type silicon carbide substrate 1, an n-type or a p-type region is formed in the openings of the ion implantation mask and by repeating this, the p-type well region 2, the p-type contact region 3, and the n-type source region 4 are formed.

A p-type ring-shaped edge termination portion (not depicted) is formed so as to surround an active region where the p-type well region is concentrated. Up through the region in which this p-type ring-shaped edge termination portion is formed is a region of one silicon carbide semiconductor device (MOSFET element), and on a single n⁻-type silicon carbide substrate 1, multiple elements are arranged.

After the ion implantation mask is removed, activation annealing is performed in an inert atmosphere of argon, etc. at a temperature of about 1700 degrees C. Next, a gate insulating film 5 is grown on an n⁻-type silicon carbide substrate 1 surface by thermal oxidation, a poly-silicon film is formed by a chemical vapor deposition (CVD) method, and a gate electrode 6 is formed by a photolithography process in a region straddling the p-type well region 2 and an adjacent p-type well region 2. On the p-type ring-shaped edge termination portion, etc., a silicon oxide film pattern may be formed in advance in regions not requiring the gate insulating film 5.

Next, an interlayer insulating film 7 formed from the silicon oxide film is formed by a CVD method, and an opening of the interlayer insulating film 7 is formed on the n-type source region 4 and the p-type contact region 3 by a photolithography process. In the formation of the opening, a mixed gas of a fluorine-based gas and noble gas is used. As a result, not only does high-precision pattern processing become possible, but an exposed portion of the n⁻-type silicon carbide substrate 1 is also etched whereby unevenness results at the exposed portion. It is presumed that at the surface of the exposed portion, carbon and silicon bonds are partially broken, resulting in a state where reaction occurs easily.

Next, using a Ni target including 20 at % to 40 at % Si, a NiSi mixed film having a thickness of 50 nm is formed by a sputtering method, a NiSi mixed film pattern is formed by photolithography in a region covering the n-type source region 4 and the p-type contact region 3.

Heating is performed by rapid thermal annealing (RTA method) at a temperature higher than 700 degrees C. and 850 degrees C. or less in an inert gas atmosphere or reduced pressure atmosphere whereby the NiSi mixed film pattern on the p-type contact region 3 and the n-type source region 4 is converted into a Ni silicide, forming an ohmic contact (electrode portion) 8. Although described hereinafter, an extraction electrode 9 is provided on the n⁻-type silicon carbide substrate 1 surface (principal surface side), and a drain electrode (rear electrode) 10 is provided on rear surface side.

In the RTA method above, the n⁻-type silicon carbide substrate 1 on which the NiSi mixed film pattern is formed is placed on a support (susceptor) formed from carbon or roughened silicon carbide, the support is heated using an infrared lamp heater whereby the n⁻-type silicon carbide substrate 1 is indirectly heated by heat conduction via the support. Since the silicon carbide substrate has a property of transmitting infrared rays, infrared rays from the heat source are absorbed by the support whereby heat conduction is used and the n⁻-type silicon carbide substrate 1 may be uniformly heated in general for a certain period of time.

A heat processing apparatus such as a vertical furnace may be used, provided the method uniformly and indirectly heats the n⁻-type silicon carbide substrate 1. As a method of heat application, a method of using heat conduction from the support, or a method of using heat conduction from the atmosphere may be used. As a result, application of excessive temperatures, which affects the gate oxide film, is suppressed and sufficient heat is provided for the formation of silicide.

Here, using the RTA method above, at a rate of temperature rise of 2 degrees C. per second, the attained temperature was changed every 100 degrees C. from 300 degrees C. to 600 degrees C., and changes in the phase state of the NiSi mixed film were identified by X-ray diffraction. The attained temperatures were maintained for 5 minutes. It was observed that at 300 degrees C., by a solid-phase reaction in the NiSi mixed film, formation of a silicide ($Ni_2Si$ phase) indicated by chemical formula $Ni_2Si$ begins; at 400 degrees C., the diffraction intensity of the $Ni_2Si$ phase becomes strong; and at higher temperatures, the diffraction intensity of the $Ni_2Si$ phase tends to decrease or be the same.

From these observations, it was found that increasing the temperature from room temperature, first, the $Ni_2Si$ phase tends to be formed. In targets where the composition of Si was changed by 5%, from 10 at % to 50 at %, it was found that when the Si composition was from 20 at % to 40 at %, the diffraction intensity of the $Ni_2Si$ phase increased and therefore, within this composition range, the solid-phase reaction sufficiently progressed in the NiSi mixed film. It was found that when the Si composition is low, unreacted Ni remains; and when the Si composition is high, Si tends to remain on the substrate as Si nodules.

Furthermore, observation was made using cross-sectional views by a transmission electron microscope (TEM) and secondary ion mass spectrometry (SIMS) when the attained temperature was changed by 50 degrees C. from 600 degrees C. to 1000 degrees C. At 700 degrees C. and higher, at an interface of the n⁻-type silicon carbide substrate 1 and $Ni_2Si$, a silicide (NiSi phase) of a few nanometers and indicated by chemical formula NiSi was formed; and at 800 degrees C., the NiSi phase in a stratified shape of about 10 nm was formed. At 1000 degrees C., it was found that a silicide was formed as if eroding away the n⁻-type silicon carbide substrate, becoming the NiSi phase overall. However, the upper temperature limit was set to 850 degrees C., which minimally affects the gate oxide film.

FIG. 2 is a chart depicting NiSi phase thickness and carbon content at each temperature of the silicon carbide semiconductor device according to the first embodiment. The NiSi phase thickness and carbon content at each temperature, calculated from TEM cross-sectional views and SIMS are depicted. Calculation of the carbon content by SIMS was performed excluding the boundary surface, using the average value of a 5 nm width from a vicinity of the boundary, and by compensating sensitivity by standard samples of NiSi and $Ni_2Si$.

As depicted in FIG. 2, it was found that at temperatures lower than 850 degrees C., since the supply of carbon does not occur on an extraction electrode 9 side, the side opposite from the n⁻-type silicon carbide substrate 1 side, carbon tended to be present in large amounts near the n⁻-type silicon carbide substrate 1 and was substantially not detected on the opposite side from the n⁻-type silicon carbide substrate 1. On the other hand, at 900 degrees C., formation of the NiSi phase progressed to the extraction electrode 9 side whereby carbon began to be detected on the extraction electrode 9 side; and at 1000 degrees C., carbon of about 20 at % was detected.

Therefore, by performing heat treatment by the RTA method above at a temperature higher than 700 degrees C. and 850 degrees C. or less, the NiSi phase may be formed in a stratified shape on the n⁻-type silicon carbide substrate 1 side, the $Ni_2Si$ phase may be formed on the extraction electrode 9 side, and the ohmic contact electrode portion 8 that does not include carbon may be formed.

In other words, embodiments of the present invention encompass an ohmic contact electrode 8 that is made up of a multi-phase nickel silicide after being heat treated by the above-described RTA process. One side of the ohmic contact electrode 8 adjacent to the silicon carbide semiconductor substrate 1, the ohmic contact electrode 8 is made up primarily of a NiSi phase. On an opposite side of the ohmic contact electrode adjacent to the extraction electrode 9, the ohmic contact electrode is made up primarily of a $Ni_2Si$ phase. In the present specification and claims, the term "primarily" means a majority of molecules on a side of the ohmic contact electrode 8 have the described chemical composition.

Further, concerning the RTA method, the effect of the temperature raising sequence was compared for contact resistivity. Contact resistivity measurement was performed after formation of the extraction electrode 9 on the ohmic electrode, using a transmission line model (TLM) method assuming a constant electrode area.

FIGS. 3, 4, and 5 are charts each depicting heat application characteristics (annealing sequence) of the silicon carbide semiconductor substrate according to the first embodiment. The example in FIG. 3 is a standard (existing) sequence of raising the temperature to 800 degrees C. at a constant rate of 2 degrees C. per second and reducing the temperature after holding the temperature at 800 degrees C. for 5 minutes.

FIG. 4 depicts a sequence of raising the temperature to 400 degrees C. at a rate of 0.5 degrees C. per second, followed by raising the temperature to 800 degrees C. at a rate of 2 degrees C. per second, maintaining the temperature at 800 degrees C. for 5 minutes, and then lowering the temperature thereafter. FIG. 5 depicts a sequence of raising the temperature to 400 degrees C. at a rate of 2 degrees C. per second, maintaining the temperature for 10 minutes and thereafter, raising the temperature to 800 degrees C. at a rate of 2 degrees C. per second, maintaining the temperature for 5 minutes and thereafter, lowering the temperature.

The annealing sequences in FIGS. 4 and 5 include a time T1 required for raising the temperature to 400 degrees C. and a maintaining process 1, and a time T2 required for raising the temperature to 850 degrees C. or less and a maintaining process 2 after the maintaining process 1. The total time T1 for raising the temperature and the maintaining process 1 is set to be longer compared to the total time T2 for raising the temperature and the maintaining process 2.

FIG. 6 is a chart depicting contact resistance in each of the heat application characteristics of the silicon carbide semiconductor substrate according to the first embodiment. As depicted in FIG. 6, it was found that in cases of processing by the annealing sequences depicted in FIGS. 4 and 5, contact resistance tends to be smaller. Results of observation by the TEM cross-sectional views reveal that for the silicide produced by the annealing sequence depicted in FIG. 4 or 5, although the average thickness of the NiSi phase formed at the n⁻-type silicon carbide substrate 1 interface was equal compared to the silicide produced by the standard annealing sequence depicted in FIG. 3, unevenness and shading of the TEM images is low and the NiSi phase tends to be dense.

These findings are presumed to have an effect of sufficiently forming the $Ni_2Si$ phase and an effect of widely forming the contact surface of the nickel silicide and the $n^-$-type silicon carbide substrate 1 since according to the annealing sequence of the first embodiment depicted in FIG. 4 or 5, a residence time at the intermediate temperature at which the $Ni_2Si$ phase is formed is present whereby segregation of the silicon and nickel may be reduced. As a result, it is thought that there is an effect in that when heating is continued, the NiSi phase forms easily at the $n^-$-type silicon carbide substrate 1 interface.

Further, comparison was made concerning surface processing methods for the opening of the interlayer insulating film 7. The $n^-$-type silicon carbide substrate 1 on which the opening of the interlayer insulating film 7 is formed was immersed in a dilute hydrofluoric acid of a 0.5% concentration and thereafter, Ni having a film thickness of 50 nm was formed by sputtering, and the RTA method was performed by the existing annealing sequence depicted in FIG. 3.

FIG. 7 is a chart depicting the immersion time of the silicon carbide semiconductor substrate according to the first embodiment in the dilute hydrofluoric acid, and the NiSi phase thickness and contact resistance measured by a TLM method. As depicted in FIG. 7, it was found that when the $n^-$-type silicon carbide substrate 1 is immersed for about 1 minute, the contact resistance increases and the NiSi phase is substantially not formed. These findings are presumed to be consequent to suppression of the solid-phase reaction with the NiSi mixed film consequent to formation of a stable SiC interface in the opening of the interlayer insulating film 7 as a result of removing silicon, etc. that is in an unstable bonding state and of the opening of the interlayer insulating film 7 that has been damaged by dry etching, consequent to immersion into the dilute hydrofluoric acid.

Therefore, to form the NiSi phase, it is desirable for the opening of the interlayer insulating film 7 to not have a stable SiC interface and as pre-processing of the nickel sputtering, etching of the $n^-$-type silicon carbide substrate 1 using a fluorine-based gas or noble gas is desirable, not pre-processing that uses a dilute hydrofluoric acid.

After the ohmic contact electrode portion 8 is formed by the processes above, the extraction electrode 9 of Al having a thickness of 5 μm is formed by patterning so as to cover the ohmic contact electrode portion 8 (refer to FIG. 1). The extraction electrode 9 is formed isolated from the source region even on the gate electrode 6 and, the source and the gate are driven independently. Further, on the rear surface of the $n^-$-type silicon carbide substrate 1, stacked films of Ti and Ni are formed, forming the drain electrode (rear electrode) 10 whereby the silicon carbide semiconductor device (MOSFET element) is formed.

A first example will be described. A double-implant-type MOSFET was produced according to the method of manufacturing a silicon carbide semiconductor device according to the first embodiment. In particular, first, the $n^-$-type silicon carbide substrate 1 on which a high-resistivity layer having an n-type doping concentration of $2\times10^{15}$ $cm^{-3}$ and a thickness of 15 μm is formed by epitaxial growth was prepared. Next, an ion implantation mask formed from a silicon dioxide film having a thickness of 1.5 μm was formed and the p-type well region 2 was formed by ion implanting Al ions at a temperature of 500 degrees C. The doping concentration was $1\times10^{16}$ $cm^3$, and the implantation depth was 1 μm.

Next, an ion implantation mask formed from a silicon dioxide film having an opening at a center of the p-type well region 2 was formed and the p-type contact region 3 was formed by implanting Al ions. The doping concentration was $1\times10^{18}$ $cm^{-3}$.

The $n^-$-type silicon carbide substrate 1 was then placed in an annealing furnace and an activation process was performed for 5 minutes at 1700 degrees C. in an Ar atmosphere. Next, an ion implantation mask formed from a silicon dioxide film having an opening at a side portion of the p-type contact region 3 in the p-type well region 2 was formed and the n-type source region 4 having a doping concentration of $1\times10^{19}$ $cm^{-3}$ was formed by implanting phosphorus ions.

The $n^-$-type silicon carbide substrate 1 was again placed in the annealing furnace and an activation process was performed for 5 minutes at 1700 degrees C. in an Ar atmosphere. Next, the $n^-$-type silicon carbide substrate 1 was placed in a quartz tube, oxygen was passed through pure water, thermal oxidation treatment was performed at 1200 degrees C. in an atmosphere that included water vapor, and on a surface of the $n^-$-type silicon carbide substrate 1 (surface of the $n^-$-type silicon carbide epitaxial layer), the gate insulating film 5 forming the silicon dioxide film was grown. The thickness of the silicon dioxide film was 700 Å.

Next, a poly-silicon film having a thickness of 0.5 μm and in which phosphorus was doped was formed by a CVD method and a poly-silicon film was patterned by photolithography whereby the gate electrode 6 was formed. The gate electrode 6 was formed from a region straddling the p-type well region 2 and an adjacent p-type well region 2 to a region of the p-type well region 2 between the $n^-$-type silicon carbide substrate 1 and the n-type source region 4.

Next, a phosphorus silicate glass (PSG) film having a thickness of 1 μm is formed by a CVD method, the PSG film was patterned by photolithography, and the interlayer insulating film 7 was formed in a region covering the gate electrode 6. Etching of the PSG was performed by reactive ion etching (RIE) using a mixed gas of $CHF_3$, $CF_4$, and Ar.

Next, using a Ni target including 30 at % silicon, a NiSi mixed film having a thickness of 60 nm was formed by a sputtering method, and the NiSi mixed film was patterned so as to remain on the TLM pattern region and the ohmic contact electrode portion 8. A Ni film of 60 nm was further formed on the rear side of the $n^-$-type silicon carbide substrate 1.

Next, the $n^-$-type silicon carbide substrate 1 was placed in a RTA furnace, thermocoupled to a carbon susceptor in a nitrogen atmosphere and measurements were taken, wherein the temperature was raised to 800 degrees C. at a rate of 2 degrees C. per second and maintained for 5 minutes to convert the NiSi mixed film pattern 10 and the NiSi mixed film pattern for the TLM measurement into a silicide. The temperature raising sequence was the same as that depicted in FIG. 3 (standard annealing sequence).

The thickness of the NiSi phase in the ohmic electrode 8 at this time was about 15 to 20 nm; the carbon detection amount of the $n^-$-type silicon carbide substrate 1 of the ohmic electrode 8 was about 15 to 20 at %; and carbon from the extraction electrode 9 side of the detection ohmic electrode 8 was not detected.

Next, an Al film having a thickness of 5 μm was formed by a sputtering method, a source contact pad, a gate contact pad, and TLM electrode pad (extraction electrode) 9 were formed. Next, on the rear side of the $n^-$-type silicon carbide substrate 1, a Ti film of 100 nm and a gold (Au) film of 200 nm were formed by a vapor deposition method by heating, to become the rear electrode 10.

The MOSFET element was produced by the processes above and, in the TLM pattern region, contact resistance (contact resistance of the n-type contact region 4 and the n-type contact pattern 8) was measured, and an average was calculated from values measured in the wafer surface.

A second example will be described. Aside from changing the temperature raising sequence of the RTA method, an element was further produced under the same production conditions in the first example. The temperature raising sequence of the RTA method in the second example is the same as that depicted in FIG. 4, i.e., after the temperature was raised to 400 degrees C. at a rate of 0.5 degrees C. per second, the temperature was raised to 800 degrees C. at a rate of 2 degrees C. per second, held at 800 degrees C. for 5 minutes, and then reduced.

The thickness of the NiSi phase in the ohmic electrode 8 at this time was about 15 to 20 nm; the carbon detection amount of the n$^-$-type silicon carbide substrate 1 of the ohmic electrode 8 was about 15 to 20 at %; and carbon from the extraction electrode 9 side of the detection ohmic electrode 8 was not detected.

Further, similar to the first example, contact resistance at the TLM pattern region was measured.

As a comparison example, an element for which surface processing of the ohmic contact hole opening was performed was produced. Similar to the first example, a phosphorus silicon glass (PSG) film having a width of 1 μm was patterned by photolithography and in a region covering the gate electrode 6, the interlayer insulating film 7 was formed. Thereafter, the substrate was immersed in 0.5 wt % hydrofluoric acid at room temperature for 1 minute and a process of removing an oxide film of the ohmic contact formation surface was performed. Further, the ohmic contact electrode and subsequent portions were implemented by a method identical to that of the first example.

The thickness of the NiSi phase in the ohmic electrode 8 at this time was about 0 to 2 nm; the carbon detection amount of the n$^-$-type silicon carbide substrate 1 of the ohmic electrode 8 was about 0 to 5 at %; and carbon from the extraction electrode 9 side of the ohmic electrode 8 was not detected.

Further, similar to the first example, contact resistance in the TLM pattern region was measured and, comparison was made with the first example and the second example. In the comparison example, the contact resistance was $1400 \times 10^{-5}$ Ωcm$^2$. The contact resistance in first example was $5 \times 10^{-5}$ Ωcm and in the second example, the contact resistance was $3 \times 10^{-5}$ Ωcm$^2$.

The embodiments described above enable an ohmic electrode having a low contact resistance to be formed at a lower temperature than a conventional temperature and enable higher performance and driving reliability to be obtained over long periods.

The invention is not limited to the embodiments described above and various modifications within a scope not departing from the spirit of the invention are possible. For example, the present invention is implemented similarly when the p-type and the n-type are interchanged, and when the conductivity type of the silicon carbide substrate and the conductivity type of an epitaxial layer to be grown in a principal surface of the silicon carbide substrate differ. In this case, a p contact pattern is formed contacting a p-type region that becomes a source region or a contact region, a NiSi mixed layer is formed contacting an n-type region that becomes a source region or a contact region, and silicide conversion is performed.

However, in the technique described in Japanese Patent Application Laid-Open Publication No. H7-99169, since the reaction of the ohmic electrode and the silicon carbide semiconductor substrate is suppressed, the ohmic electrode and the silicon carbide semiconductor substrate are not adhered to each other or only have partially adhered sites and thus, have a short-coming in that peeling occurs with long periods of operation and failure to function as an ohmic electrode.

Further, since the technique described in Japanese Patent Application Laid-Open Publication No. 2012-99598 is a method of using laser for short-period, local, direct heating of the silicon carbide substrate or metal film having differing absorption wavelengths, the technique is problematic in that the state of heating easily varies depending on the thickness of the metal film and the thickness of the silicon carbide substrate.

Japanese Patent Application Laid-Open Publication No. 2012-99598 describes that use of laser having a shorter wavelength than the absorption wavelength of the silicon carbide substrate is desirable. In this case, the silicon carbide substrate is heated by laser whereby a nickel silicon alloy or nickel and the silicon carbide substrate react, the formation of a silicide progresses to the electrode surface side, and carbon supplied from the silicon carbide substrate undergoes a process of diffusion. Therefore, the gate oxide film adjacent to the ohmic electrode portion may also be heated to the same temperature as that in Japanese Patent Application Laid-Open Publication No. H1-268121 by heat conduction of the silicon carbide substrate.

When the laser irradiation is suppressed to suppress this occurrence, the formation of silicide is suppressed and similar to Japanese Patent Application Laid-Open Publication No. H7-99169, the problems of the adhesiveness with the silicon carbide semiconductor substrate being weak, the occurrence of peeling with operation for long periods, and failure to function as an ohmic electrode occur as well as a problem of stable formation of the ohmic electrode being difficult.

However, according to the invention described above, by heat treatment at a temperature higher than 700 degrees C. and 850 degrees C. or less, the NiSi phase on the n$^-$-type silicon carbide substrate 1 side may be formed in a striated shape; the Ni$_2$Si phase may be formed on the extraction electrode side; and an ohmic contact electrode portion that does not include carbon may be formed. Further, formation of the ohmic electrode at a lower temperature than a conventional temperature lowers the contact resistance and enables higher performance and driving reliability to be obtained over long periods.

The present invention enables an ohmic electrode to be formed that has low contact resistance and provides excellent driving reliability over long periods.

As described, the silicon carbide semiconductor device and the method of manufacturing a silicon carbide semiconductor device according to the present invention is suitable for vertical semiconductor elements in which current flows from the front surface side of the semiconductor substrate to the rear surface side and, for example, is useful for power semiconductor devices such as power devices as well as power semiconductor elements used in industrial motor control and engine control.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device comprising:
a silicon carbide semiconductor substrate;
a nickel silicide film provided on a surface of the silicon carbide semiconductor substrate and functioning as a contact electrode; and
an extraction electrode formed contacting the contact electrode on a first side of the contact electrode different from a second side of the contact electrode facing the silicon carbide semiconductor substrate,
wherein the contact electrode is a multi-phase nickel silicide made up of primarily a NiSi phase on the silicon carbide semiconductor substrate side of the contact electrode and primarily a $Ni_2Si$ phase on the first side of the contact electrode,
the contact electrode includes carbon on the silicon carbide semiconductor substrate side and includes no carbon on the extraction electrode side, and
wherein, in the contact electrode, a carbon concentration at the second side near the semiconductor substrate is not more that 20 at %, and a carbon concentration at the first side near the extraction electrode is not more than 5 at %.

2. The silicon carbide semiconductor device according to claim 1, wherein the silicon carbide semiconductor substrate includes a first contact region of a first conductivity type in a surface of the silicon carbide semiconductor substrate, and a second contact region of a second conductivity type in the surface of the silicon carbide semiconductor substrate surrounding the first contact region,
the contact electrode covers the first contact region and a portion of the second region, and
the extraction electrode covers the contact electrode and a portion of the second region not covered by the contact electrode.

3. The silicon carbide semiconductor device according to claim 1, wherein the contact electrode is formed by heating a nickel silicon mixed film to form an $Ni_2Si$ structure, and by further heating the $Ni_2Si$ structure to form the NiSi phase at a junction of the $Ni_2Si$ structure and the silicon carbide semiconductor substrate.

4. The silicon carbide semiconductor device according to claim 1, wherein the NiSi phase has a thickness in a range more than 0 nm and no more than 30 nm.

* * * * *